(12) United States Patent
Song et al.

(10) Patent No.: US 11,587,633 B2
(45) Date of Patent: Feb. 21, 2023

(54) DIRECT TESTING OF IN-PACKAGE MEMORY

(71) Applicant: Micron Technology, Inc., Boise, ID (US)

(72) Inventors: Taeksang Song, San Jose, CA (US); Hyunyoo Lee, Boise, ID (US); Saira Samar Malik, Lafayette, IN (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/349,612

(22) Filed: Jun. 16, 2021

(65) Prior Publication Data
US 2021/0398601 A1    Dec. 23, 2021

Related U.S. Application Data

(60) Provisional application No. 63/042,955, filed on Jun. 23, 2020.

(51) Int. Cl.
| | |
|---|---|
| *G11C 29/10* | (2006.01) |
| *G11C 29/36* | (2006.01) |
| *G11C 29/14* | (2006.01) |
| *G11C 29/18* | (2006.01) |
| *G11C 29/12* | (2006.01) |

(52) U.S. Cl.
CPC ........ *G11C 29/10* (2013.01); *G11C 29/12015* (2013.01); *G11C 29/14* (2013.01); *G11C 29/18* (2013.01); *G11C 29/36* (2013.01); *G11C 2029/1802* (2013.01)

(58) Field of Classification Search
CPC ... G11C 29/10; G11C 29/12015; G11C 29/14; G11C 29/18; G11C 29/36
See application file for complete search history.

(56) References Cited

U.S. PATENT DOCUMENTS

2017/0004869 A1*  1/2017  Shin ................... G11C 8/18
2020/0278802 A1*  9/2020  Suh ................... G06F 1/3275

* cited by examiner

*Primary Examiner* — Mohammed A Bashar
(74) *Attorney, Agent, or Firm* — Holland & Hart LLP

(57) ABSTRACT

Methods, systems, and devices for direct testing of in-package memory are described. A memory subsystem package may include non-volatile memory, volatile memory that may be configured as a cache, and a controller. The memory subsystem may support direct access to the non-volatile memory for testing the non-volatile memory in the package using a host interface of the memory subsystem rather than using dedicated contacts on the package. To ensure deterministic behavior during testing operations, the memory subsystem may, when operating with a test mode enabled, forward commands received from a host device (such as automated test equipment) to a memory interface of the non-volatile memory and bypass the cache-related circuitry. The memory subsystem may include a separate conductive path that bypasses the cache for forwarding commands and addresses to the memory interface during testing.

22 Claims, 6 Drawing Sheets

DIRECT TESTING OF IN-PACKAGE MEMORY

CROSS REFERENCE

The present Application for Patent claims the benefit of U.S. Provisional Patent Application No. 63/042,955 by SONG et al., entitled "DIRECT TESTING OF IN-PACKAGE MEMORY," filed Jun. 23, 2020, assigned to the assignee hereof, and expressly incorporated by reference herein.

BACKGROUND

The following relates generally to one or more systems and more specifically to direct testing for in-package memory.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
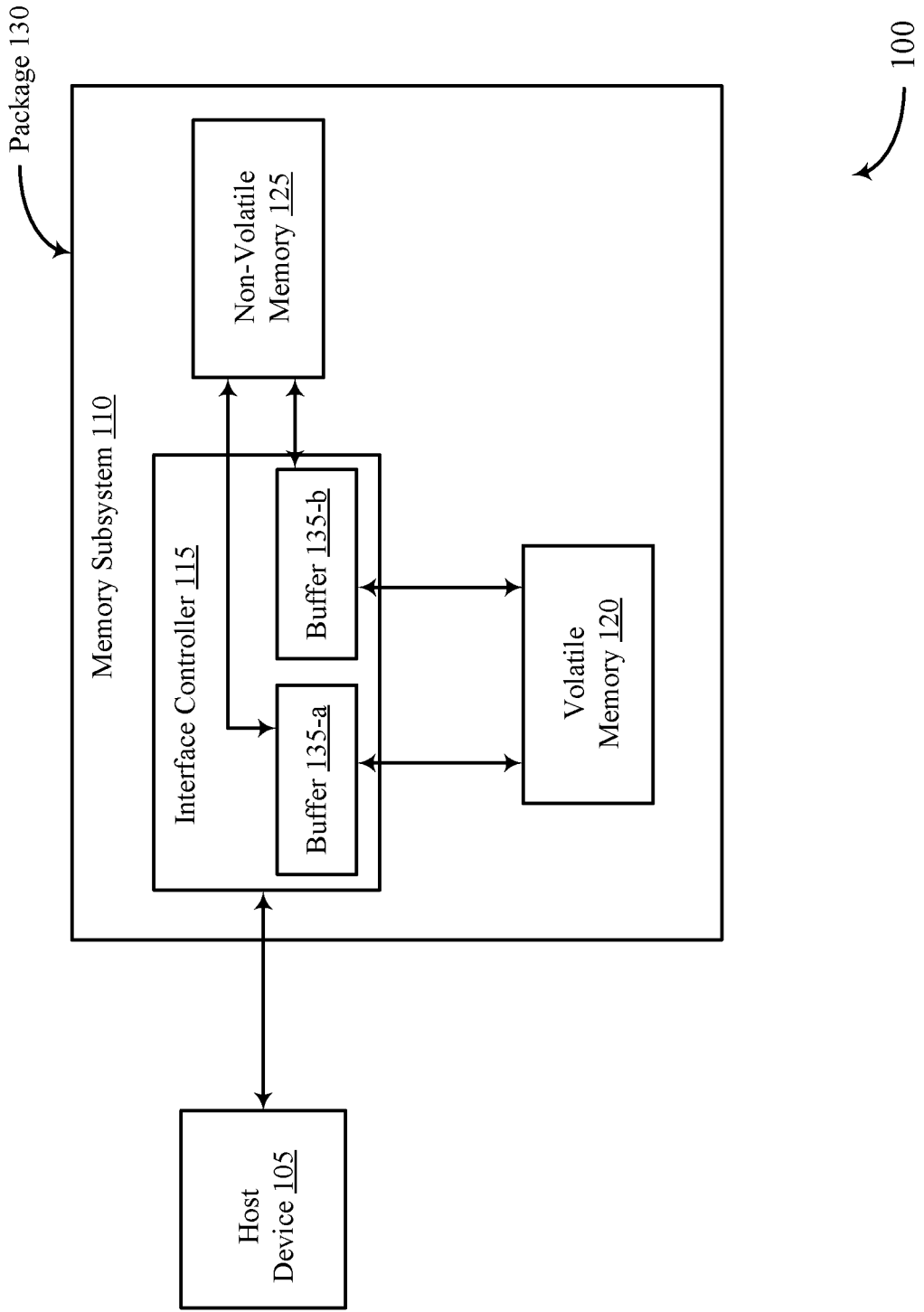
FIG. 1 shows a diagram of a system including a system that supports direct testing for in-package memory in accordance with examples of the present disclosure.

A memory die that is within a package may be tested by providing test signals to the package to read data from or write data to the memory die. In some cases, such a memory package may include one or more external electrical contacts, such as balls or other type of contact) that may provide direct access to the memory die and may be used to receive and transmit test signals from a test device, such as from automated testing equipment (ATE), for testing the memory die.

In some examples, a single package may contain a memory subsystem that includes a controller and one or more memory dice, along with other circuitry. The memory subsystem may support testing a memory die in the package by communicating signals with an ATE using a host interface (e.g., a standardized I/O interface) that is included in the package, such as a low-power double-data rate (LPDDR) interface, rather than using dedicated electrical contacts. For example, the controller may receive test commands from the ATE (e.g., using the host interface), facilitate or cause corresponding operations to be performed on the memory die, and provide output signals to the ATE (e.g., using the host interface). Such an approach may reduce the quantity of contacts on the package, or the quantity of pins of the memory die, or may free up such contacts or pins for other uses, etc.

In some examples, a memory subsystem may include cache circuitry (e.g., including a separate memory die in the subsystem that operates as a cache) for accelerating memory accesses. Such cache circuitry may introduce timing or data uncertainty for memory access operations, which may be undesirable during test operations. Thus, in some cases, it may be desirable to test the functionality of a memory die within the subsystem directly (e.g., while avoiding the effects of caches or other various features of the memory subsystem). In some examples, some or all of the cache-related features of a memory subsystem and/or other features of the memory subsystem may be bypassed during test operations to provide in-order command operation without invalid data return, deterministic latency, and gapless (e.g., sequential, without intervening clock cycles or operations) access to the memory die during the test operations. For example, to bypass the cache during test operations, the controller may forward commands received from an ATE to a memory interface that is coupled with the memory die without using the cache features or circuitry, such as using a conductive path that bypasses the cache circuitry.

In some examples, a memory die of a memory subsystem may include a type of memory that uses a different communication protocol than a communication protocol used by an interface, such as a host interface (e.g., a standardized I/O interface) of the memory subsystem. For example, a memory die may be configured to use a first quantity of bits for specifying a row address, and the host interface may be configured or specified to receive a different quantity of bits for specifying a row address (e.g., to activate a row of memory). For example, an 8 GB FeRAM memory may use 28 total bits to activate a row (including bits specifying a bank of the FeRAM), but the memory subsystem may receive only 22 total address bits when receiving activation commands from an ATE using the host interface. Thus, in some cases, a memory subsystem may perform protocol translation of signals received via the host interface to translate row addresses or other communication parameters to a format that is appropriate for the memory die.

In some examples, bypassing some or all of the cache-related features of the memory subsystem may also bypass some or all of the circuitry used for protocol translation. Moreover, testing a memory die via a standardized interface of the memory subsystem rather than directly (e.g., using dedicated contacts) may introduce timing delays or other differences relative to testing the memory die directly. Thus, a memory subsystem may include various features for implementing protocol translation and/or timing adjustment during test operations. For example, a memory subsystem may, in conjunction with forwarding a command to a memory interface for test operations, append additional bits to a row address received from the ATE to generate a row address appropriate for the memory die by appending a value stored in a register of the memory subsystem. Other operations may also be performed by a memory subsystem during testing operations to compensate for changes in timing or behavior of the memory die or memory subsystem during testing operations relative to timing and behavior that the ATE may be expecting (e.g., when the cache is enabled, or when a memory die is tested using dedicated contacts without using a controller).

Features of the disclosure are initially described in the context of a system and subsystem as described with reference to FIGS. 1, 2, and 3. Features of the disclosure are described in the context of a process flow as described with reference to FIG. 4. These and other features of the disclosure are further illustrated by and described with reference to an apparatus diagram and one or more flowcharts that relate to direct testing for in-package memory as described with reference to FIGS. 5 and 6.

FIG. 1 illustrates an example of a system 100 that supports direct testing for in-package memory in accordance with examples as disclosed herein. The system 100 may be included in an electronic device such a computer or phone. The system 100 may include a host device 105 and a memory subsystem 110. The host device 105 may be a processor or system-on-a-chip (SoC) that interfaces with the interface controller 115 as well as other components of the electronic device that includes the system 100. The memory subsystem 110 may store and provide access to electronic information (e.g., digital information, data) for the host device 105. The memory subsystem 110 may include an interface controller 115, a volatile memory 120, and a non-volatile memory 125. In some examples, the interface controller 115, the volatile memory 120, and the non-volatile memory 125 may be included in a same physical package such as a package 130. However, the interface controller 115, the volatile memory 120, and the non-volatile memory 125 may be disposed on different, respective dies (e.g., silicon dies).

The devices in the system 100 may be coupled by various conductive lines (e.g., traces, printed circuit board (PCB) routing, redistribution layer (RDL) routing) that may enable the communication of information (e.g., commands, addresses, data) between the devices. The conductive lines may make up channels, data buses, command buses, address buses, and the like.

The memory subsystem 110 may be configured to provide the benefits of the non-volatile memory 125 while maintaining compatibility with a host device 105 that supports protocols for a different type of memory, such as the volatile memory 120, among other examples. For example, the non-volatile memory 125 may provide benefits (e.g., relative to the volatile memory 120) such as non-volatility, higher capacity, or lower power consumption. But the host device 105 may be incompatible or inefficiently configured with various aspects of the non-volatile memory 125. For instance, the host device 105 may support voltages, access latencies, protocols, page sizes, etc. that are incompatible with the non-volatile memory 125. To compensate for the incompatibility between the host device 105 and the non-volatile memory 125, the memory subsystem 110 may be configured with the volatile memory 120, which may be compatible with the host device 105 and serve as a cache for the non-volatile memory 125. Thus, the host device 105 may use protocols supported by the volatile memory 120 while benefitting from the advantages of the non-volatile memory 125.

In some examples, the system 100 may be included in, or coupled with, a computing device, electronic device, mobile computing device, or wireless device. The device may be a portable electronic device. For example, the device may be a computer, a laptop computer, a tablet computer, a smartphone, a cellular phone, a wearable device, an internet-connected device, or the like. In some examples, the device may be configured for bi-directional wireless communication via a base station or access point. In some examples, the device associated with the system 100 may be capable of machine-type communication (MTC), machine-to-machine (M2M) communication, or device-to-device (D2D) communication. In some examples, the device associated with the system 100 may be referred to as a user equipment (UE), station (STA), mobile terminal, or the like.

The host device 105 may be configured to interface with the memory subsystem 110 using a first protocol (e.g., LPDDR) supported by the interface controller 115. Thus, the host device 105 may, in some examples, interface with the interface controller 115 directly and the non-volatile memory 125 and the volatile memory 120 indirectly. In alternative examples, the host device 105 may interface directly with the non-volatile memory 125 and the volatile memory 120. The host device 105 may also interface with other components of the electronic device that includes the system 100. The host device 105 may be or include an SoC, a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In some examples, the host device 105 may be referred to as a host. In some examples, the host device 105 may represent or may include an ATE and may perform testing procedures on non-volatile memory 125 and/or volatile memory 120.

The interface controller 115 may be configured to interface with the volatile memory 120 and the non-volatile memory 125 on behalf of the host device 105 (e.g., based on one or more commands or requests issued by the host device 105). For instance, the interface controller 115 may facilitate the retrieval and storage of data in the volatile memory 120 and the non-volatile memory 125 on behalf of the host device 105. Thus, the interface controller 115 may facilitate data transfer between various subcomponents, such as between at least some of the host device 105, the volatile memory 120, or the non-volatile memory 125. The interface controller 115 may interface with the host device 105 and the volatile memory 120 using the first protocol and may interface with the non-volatile memory 125 using a second protocol supported by the non-volatile memory 125.

The non-volatile memory 125 may be configured to store digital information (e.g., data) for the electronic device that includes the system 100. Accordingly, the non-volatile memory 125 may include an array or arrays of memory cells and a local memory controller configured to operate the array(s) of memory cells. In some examples, the memory cells may be or include FeRAM cells (e.g., the non-volatile memory 125 may be FeRAM). The non-volatile memory 125 may be configured to interface with the interface controller 115 using the second protocol that is different than the first protocol used between the interface controller 115 and the host device 105. In some examples, the non-volatile memory 125 may have a longer latency for access operations than the volatile memory 120. For example, retrieving data from the non-volatile memory 125 may take longer than retrieving data from the volatile memory 120. Similarly, writing data to the non-volatile memory 125 may take longer than writing data to the volatile memory 120. In some examples, the non-volatile memory 125 may have a smaller page size than the volatile memory 120, as described herein.

The volatile memory 120 may be configured to operate as a cache for one or more components, such as the non-volatile memory 125. For example, the volatile memory 120 may store information (e.g., data) for the electronic device that includes the system 100. Accordingly, the volatile memory 120 may include an array or arrays of memory cells and a local memory controller configured to operate the array(s) of memory cells. In some examples, the memory cells may be or include DRAM cells (e.g., the volatile memory may be DRAM). The non-volatile memory 125 may be configured to interface with the interface controller 115 using the first protocol that is used between the interface controller 115 and the host device 105.

In some examples, the volatile memory 120 may have a shorter latency for access operations than the non-volatile memory 125. For example, retrieving data from the volatile memory 120 may take less time than retrieving data from the non-volatile memory 125. Similarly, writing data to the volatile memory 120 may take less time than writing data to the non-volatile memory 125. In some examples, the volatile memory 120 may have a larger page size than the non-volatile memory 125. For instance, the page size of volatile memory 120 may be 2 kilobytes (2 kB) and the page size of non-volatile memory 125 may be 64 bytes (64B) or 128 bytes (128B).

Although the non-volatile memory 125 may be a higher-density memory than the volatile memory 120, accessing the non-volatile memory 125 may take longer than accessing the volatile memory 120 (e.g., due to different architectures and protocols, among other reasons). Accordingly, operating the volatile memory 120 as a cache may reduce latency in the system 100. As an example, an access request for data from the host device 105 may be satisfied relatively quickly by retrieving the data from the volatile memory 120 rather than from the non-volatile memory 125. To facilitate operation of the volatile memory 120 as a cache, the interface controller 115 may include multiple buffers 135. The buffers 135 may be disposed on the same die as the interface controller 115 and may be configured to temporarily store data for transfer between the volatile memory 120, the non-volatile memory 125, or the host device 105 (or any combination thereof) during one or more access operations (e.g., storage and retrieval operations).

An access operation may also be referred to as an access process or access procedure and may involve one or more sub-operations that are performed by one or more of the components of the memory subsystem 110. Examples of access operations may include storage operations in which data provided by the host device 105 is stored (e.g., written to) in the volatile memory 120 or the non-volatile memory 125 (or both), and retrieval operations in which data requested by the host device 105 is obtained (e.g., read) from the volatile memory 120 or the non-volatile memory 125 and is returned to the host device 105.

To store data in the memory subsystem 110, the host device 105 may initiate a storage operation (or "storage process") by transmitting a storage command (also referred to as a storage request, a write command, or a write request) to the interface controller 115. The storage command may target a set of non-volatile memory cells in the non-volatile memory 125. In some examples, a set of memory cells may also be referred to as a portion of memory. The host device 105 may also provide the data to be written to the set of non-volatile memory cells to the interface controller 115. The interface controller 115 may temporarily store the data in the buffer 135-*a*. After storing the data in the buffer 135-*a*, the interface controller 115 may transfer the data from the buffer 135-*a* to the volatile memory 120 or the non-volatile memory 125 or both. In write-through mode, the interface controller 115 may transfer the data to both the volatile memory 120 and the non-volatile memory 125. In write-back mode, the interface controller 115 may only transfer the data to the volatile memory 120.

In either mode, the interface controller 115 may identify an appropriate set of one or more volatile memory cells in the volatile memory 120 for storing the data associated with the storage command. To do so, the interface controller 115 may implement set-associative mapping in which each set (e.g., block) of one or more non-volatile memory cells in the non-volatile memory 125 may be mapped to multiple sets of volatile memory cells in the volatile memory 120. For instance, the interface controller 115 may implement n-way associative mapping which allows data from a set of non-volatile memory cells to be stored in one of n sets of volatile memory cells in the volatile memory 120. Thus, the interface controller 115 may manage the volatile memory 120 as a cache for the non-volatile memory 125 by referencing the n sets of volatile memory cells associated with a targeted set of non-volatile memory cells. As used herein, a "set" of objects may refer to one or more of the objects unless otherwise described or noted. Although described with reference to set-associative mapping, the interface controller 115 may manage the volatile memory 120 as a cache by implementing one or more other types of mapping such as direct mapping or associative mapping, among other examples.

After determining which n sets of volatile memory cells are associated with the targeted set of non-volatile memory cells, the interface controller 115 may store the data in one or more of the n sets of volatile memory cells. This way, a subsequent retrieval command from the host device 105 for the data can be efficiently satisfied by retrieving the data from the lower-latency volatile memory 120 instead of retrieving the data from the higher-latency non-volatile memory 125. The interface controller 115 may determine which of the n sets of the volatile memory 120 to store the data based on one or more parameters associated with the data stored in the n sets of the volatile memory 120, such as the validity, age, or modification status of the data. Thus, a storage command by the host device 105 may be wholly (e.g., in write-back mode) or partially (e.g., in write-through mode) satisfied by storing the data in the volatile memory 120. To track the data stored in the volatile memory 120, the interface controller 115 may store for one or more sets of volatile memory cells (e.g., for each set of volatile memory cells) a tag address that indicates the non-volatile memory cells with data stored in a given set of volatile memory cells.

To retrieve data from the memory subsystem 110, the host device 105 may initiate a retrieval operation (also referred to as a retrieval process) by transmitting a retrieval command (also referred to as a retrieval request, a read command, or a read request) to the interface controller 115. The retrieval command may target a set of one or more non-volatile memory cells in the non-volatile memory 125. Upon receiving the retrieval command, the interface controller 115 may check for the requested data in the volatile memory 120. For instance, the interface controller 115 may check for the requested data in the n sets of volatile memory cells associated with the targeted set of non-volatile memory cells. If one of the n sets of volatile memory cells stores the requested data (e.g., stores data for the targeted set of non-volatile memory cells), the interface controller 115 may transfer the data from the volatile memory 120 to the buffer 135-a (e.g., in response to determining that one of the n sets of volatile memory cells stores the requested data) so that it can be transmitted to the host device 105. The term "hit" may be used to refer to the scenario where the volatile memory 120 stores data requested by the host device 105. If then sets of one or more volatile memory cells do not store the requested data (e.g., the n sets of volatile memory cells store data for a set of non-volatile memory cells other than the targeted set of non-volatile memory cells), the interface controller 115 may transfer the requested data from the non-volatile memory 125 to the buffer 135-a (e.g., in response to determining that the n sets of volatile memory cells do not store the requested data) so that it can be transmitted to the host device 105. The term "miss" may be used to refer to the scenario where the volatile memory 120 does not store data requested by the host device 105.

In a miss scenario, after transferring the requested data to the buffer 135-a, the interface controller 115 may transfer the requested data from the buffer 135-a to the volatile memory 120 so that subsequent read requests for the data can be satisfied by the volatile memory 120 instead of the non-volatile memory 125. For example, the interface controller 115 may store the data in one of the n sets of volatile memory cells associated with the targeted set of non-volatile memory cells. But the n sets of volatile memory cells may already be storing data for other sets of non-volatile memory cells. So, to preserve this other data, the interface controller 115 may transfer the other data to the buffer 135-b so that it can be transferred to the non-volatile memory 125 for storage. Such a process may be referred to as "eviction" and the data transferred from the volatile memory 120 to the buffer 135-b may be referred to as "victim" data. In some cases, the interface controller 115 may transfer a subset of the victim data from the buffer 135-b to the non-volatile memory 125. For example, the interface controller 115 may transfer one or more subsets of victim data that have changed since the data was initially stored in the non-volatile memory 125. Data that is inconsistent between the volatile memory 120 and the non-volatile memory 125 (e.g., due to an update in one memory and not the other) may be referred to in some cases as "modified" or "dirty" data. In some examples (e.g., when interface controller operates in one mode such as a write-back mode), dirty data may be data that is present in the volatile memory 120 but not present in the non-volatile memory 125.

As described herein, memory subsystem 110 may include various features or circuitry for bypassing the cache and associated circuitry (e.g., volatile memory 120, buffer 135-a, buffer 135-b, and/or other components of memory subsystem 110) during testing operations.

Figure 2:
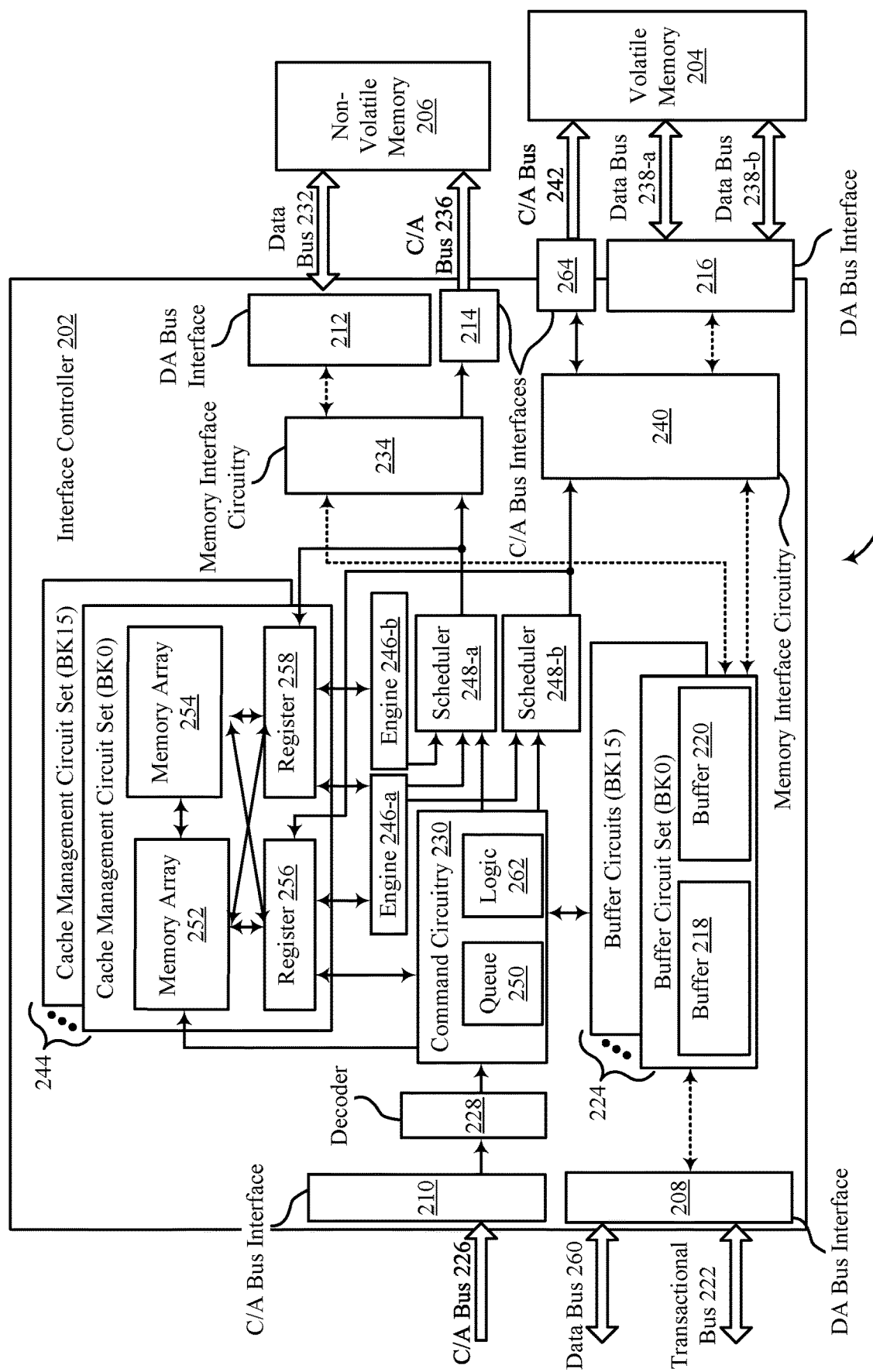
FIG. 2 illustrates an exemplary system or subsystem that supports direct testing for in-package memory in accordance with examples of the present disclosure.

FIG. 2 illustrates an example of memory subsystem 200 that supports direct testing for in-package memory in accordance with examples as disclosed herein. The memory subsystem 200 may be an example of the memory subsystem 110 described with reference to FIG. 1. Accordingly, the memory subsystem 200 may interact with a host device as described with reference to FIG. 1. The memory subsystem 200 may include an interface controller 202, a volatile memory 204, and a non-volatile memory 206, which may be examples of the interface controller 115, the volatile memory 120, and the non-volatile memory 125, respectively, as described with reference to FIG. 1. Thus, the interface controller 202 may interface with the volatile memory 204 and the non-volatile memory 206 on behalf of the host device as described with reference to FIG. 1. For example, the interface controller 202 may operate the volatile memory 204 as a cache for the non-volatile memory 206. Operating the volatile memory 204 as the cache may allow subsystem to provide the benefits of the non-volatile memory 206 (e.g., non-volatile, high-density storage) while maintaining compatibility with a host device that supports a different protocol than the non-volatile memory 206.

In FIG. 2, dashed lines between components represent the flow of data or communication paths for data and solid lines between components represent the flow of commands or communication paths for commands. In some cases, the memory subsystem 200 is one of multiple similar or identical subsystems that may be included in an electronic device. Each subsystem may be referred to as a slice and may be associated with a respective channel of a host device in some examples.

The non-volatile memory 206 may be configured to operate as a main memory (e.g., memory for long-term data storage) for a host device. In some cases, the non-volatile memory 206 may include one or more arrays of FeRAM cells. Each FeRAM cell may include a selection component and a ferroelectric capacitor, and may be accessed by applying appropriate voltages to one or more access lines such as word lines, plates lines, and digit lines. In some examples, a subset of FeRAM cells coupled with to an activated word line may be sensed, for example concurrently or simultaneously, without having to sense all FeRAM cells coupled with the activated word line. Accordingly, a page size for an FeRAM array may be different than (e.g., smaller than) a DRAM page size. In the context of a memory device, a page may refer to the memory cells in a row (e.g., a group of the memory cells that have a common row address) and a page size may refer to the number of memory cells or column addresses in a row, or the number of column addresses accessed during an access operation. Alternatively, a page size may refer to a size of data handled by various interfaces. In some cases, different memory device types may have different page sizes. For example, a DRAM page size (e.g., 2kB) may be a superset of a non-volatile memory (e.g., FeRAM) page size (e.g., 64B).

A smaller page size of an FeRAM array may provide various efficiency benefits, as an individual FeRAM cell may require more power to read or write than an individual DRAM cell. For example, a smaller page size for an FeRAM array may facilitate effective energy usage because a smaller number of FeRAM cells may be activated when an associated change in information is minor. In some examples, the page size for an array of FeRAM cells may vary, for example dynamically (e.g., during operation of the array of FeRAM cells) depending on the nature of data and command utilizing FeRAM operation.

Although an individual FeRAM cell may require more power to read or write than an individual DRAM cell, an FeRAM cell may maintain its stored logic state for an extended period of time in the absence of an external power source, as the ferroelectric material in the FeRAM cell may maintain a non-zero electric polarization in the absence of an electric field. Therefore, including an FeRAM array in the non-volatile memory 206 may provide efficiency benefits relative to volatile memory cells (e.g., DRAM cells in the volatile memory 204), as it may reduce or eliminate requirements to perform refresh operations.

The volatile memory 204 may be configured to operate as a cache for the non-volatile memory 206. In some cases, the volatile memory 204 may include one or more arrays of DRAM cells. Each DRAM cell may include a capacitor that includes a dielectric material to store a charge representative of the programmable state. The memory cells of the volatile memory 204 may be logically grouped or arranged into one or more memory banks (as referred to herein as "banks"). For example, volatile memory 204 may include sixteen banks. The memory cells of a bank may be arranged in a grid or an array of intersecting columns and rows and each memory cell may be accessed or refreshed by applying appropriate voltages to the digit line (e.g., column line) and word line (e.g., row line) for that memory cell. The rows of a bank may be referred to pages, and the page size may refer to the number of columns or memory cells in a row. As noted, the page size of the volatile memory 204 may be different than (e.g., larger than) the page size of the non-volatile memory 206.

The interface controller 202 may include various circuits for interfacing (e.g., communicating) with other devices, such as a host device, the volatile memory 204, and the non-volatile memory 206. For example, the interface controller 202 may include a data (DA) bus interface 208, a command and address (C/A) bus interface 210, a data bus interface 212, a C/A bus interface 214, a data bus interface 216, and a C/A bus interface 264. The data bus interfaces may support the communication of information using one or more communication protocols. For example, the data bus interface 208, the C/A bus interface 210, the data bus interface 216, and the C/A bus interface 264 may support information that is communicated using a first protocol (e.g., LPDDR signaling), whereas the data bus interface 212 and the C/A bus interface 214 may support information communicated using a second protocol. Thus, the various bus interfaces coupled with the interface controller 202 may support different amounts of data or data rates.

The data bus interface 208 may be coupled with the data bus 260, the transactional bus 222, and the buffer circuitry 224. The data bus interface 208 may be configured to transmit and receive data over the data bus 260 and control information (e.g., acknowledgements/negative acknowledgements) or metadata over the transactional bus 222. The data bus interface 208 may also be configured to transfer data between the data bus 260 and the buffer circuitry 224. The data bus 260 and the transactional bus 222 may be coupled with the interface controller 202 and the host device such that a conductive path is established between the interface controller 202 and the host device. In some examples, the pins of the transactional bus 222 may be referred to as data mask inversion (DMI) pins. Although shown with one data bus 260 and one transactional bus 222, there may be any number of data buses 260 and any number of transactional buses 222 coupled with one or more data bus interfaces 208.

The C/A bus interface 210 may be coupled with the C/A bus 226 and the decoder 228. The C/A bus interface 210 may be configured to transmit and receive commands and addresses over the C/A bus 226. The commands and addresses received over the C/A bus 226 may be associated with data received or transmitted over the data bus 260. The C/A bus interface 210 may also be configured to transmit commands and addresses to the decoder 228 so that the decoder 228 can decode the commands and relay the decoded commands and associated addresses to the command circuitry 230.

The data bus interface 212 may be coupled with the data bus 232 and the memory interface circuitry 234. The data bus interface 212 may be configured to transmit and receive data over the data bus 232, which may be coupled with the non-volatile memory 206. The data bus interface 212 may also be configured to transfer data between the data bus 232 and the memory interface circuitry 234. The C/A bus interface 214 may be coupled with the C/A bus 236 and the memory interface circuitry 234. The C/A bus interface 214 may be configured to receive commands and addresses from the memory interface circuitry 234 and relay the commands and the addresses to the non-volatile memory 206 (e.g., to a local controller of the non-volatile memory 206) over the C/A bus 236. The commands and the addresses transmitted over the C/A bus 236 may be associated with data received or transmitted over the data bus 232. The data bus 232 and the C/A bus 236 may be coupled with the interface controller 202 and the non-volatile memory 206 such that conductive paths are established between the interface controller 202 and the non-volatile memory 206.

The data bus interface 216 may be coupled with the data buses 238 and the memory interface circuitry 240. The data bus interface 216 may be configured to transmit and receive data over the data buses 238, which may be coupled with the volatile memory 204. The data bus interface 216 may also be configured to transfer data between the data buses 238 and the memory interface circuitry 240. The C/A bus interface 264 may be coupled with the C/A bus 242 and the memory interface circuitry 240. The C/A bus interface 264 may be configured to receive commands and addresses from the memory interface circuitry 240 and relay the commands and the addresses to the volatile memory 204 (e.g., to a local controller of the volatile memory 204) over the C/A bus 242. The commands and addresses transmitted over the C/A bus 242 may be associated with data received or transmitted over the data buses 238. The data bus 238 and the C/A bus 242 may be coupled with the interface controller 202 and the volatile memory 204 such that conductive paths are established between the interface controller 202 and the volatile memory 204.

In addition to buses and bus interfaces for communicating with coupled devices, the interface controller 202 may include circuitry for operating the non-volatile memory 206 as a main memory and the volatile memory 204 as a cache. For example, the interface controller 202 may include command circuitry 230, buffer circuitry 224, cache management circuitry 244, one or more engines 246, and one or more schedulers 248.

The command circuitry 230 may be coupled with the buffer circuitry 224, the decoder 228, the cache management circuitry 244, and the schedulers 248, among other components. The command circuitry 230 may be configured to receive command and address information from the decoder 228 and store the command and address information in the queue 250. The command circuitry 230 may include logic 262 that processes command information (e.g., from a host device) and storage information from other components (e.g., the cache management circuitry 244, the buffer circuitry 224) and uses that information to generate one or more commands for the schedulers 248. The command circuitry 230 may also be configured to transfer address information (e.g., address bits) to the cache management circuitry 244. In some examples, the logic 26 2522 may be a circuit configured to operate as a finite state machine (FSM).

The buffer circuitry 224 may be coupled with the data bus interface 208, the command circuitry 230, the memory interface circuitry 234, and the memory interface circuitry 234. The buffer circuitry 224 may include a set of one or more buffer circuits for at least some banks, if not each bank, of the volatile memory 204. The buffer circuitry 224 may also include components (e.g., a memory controller) for accessing the buffer circuits. In one example, the volatile memory 204 may include sixteen banks and the buffer circuitry 224 may include sixteen sets of buffer circuits. Each set of the buffer circuits may be configured to store data from or for (or both) a respective bank of the volatile memory 204. As an example, the buffer circuit set for bank 0 (BK0) may be configured to store data from or for (or both) the first bank of the volatile memory 204 and the buffer circuit for bank 15 (BK15) may be configured to store data from or for (or both) the sixteenth bank of the volatile memory 204.

Each set of buffer circuits in the buffer circuitry 224 may include a pair of buffers. The pair of buffers may include one buffer (e.g., an open page data (OPD) buffer) configured to store data targeted by an access command (e.g., a storage command or retrieval command) from the host device and another buffer (e.g., a victim page data (VPD) buffer) configured to store data for an eviction process that results from the access command. For example, the buffer circuit set for BK0 may include the buffer 218 and the buffer 220, which may be examples of buffer 135-a and 135-b, respectively. The buffer 218 may be configured to store BK0 data that is targeted by an access command from the host device. And the buffer 220 may be configured to store data that is transferred from BK0 as part of an eviction process triggered by the access command. Each buffer in a buffer circuit set may be configured with a size (e.g., storage capacity) that corresponds to a page size of the volatile memory 204. For example, if the page size of the volatile memory 204 is 2 kB, the size of each buffer may be 2 kB. Thus, the size of the buffer may be equivalent to the page size of the volatile memory 204 in some examples.

The cache management circuitry 244 may be coupled with the command circuitry 230, the engines 246, and the schedulers 248, among other components. The cache management circuitry 244 may include a cache management circuit set for one or more banks (e.g., each bank) of volatile memory. As an example, the cache management circuitry 244 may include sixteen cache management circuit sets for BK0 through BK15. Each cache management circuit set may include two memory arrays that may be configured to store storage information for the volatile memory 204. As an example, the cache management circuit set for BK0 may include a memory array 252 (e.g., a CDRAM Tag Array (CDT-TA)) and a memory array 254 (e.g., a CDRAM Valid (CDT-V) array), which may be configured to store storage information for BK0. The memory arrays may also be referred to as arrays or buffers in some examples. In some cases, the memory arrays may be or include volatile memory cells, such as SRAM cells.

Storage information may include content information, validity information, or dirty information (or any combination thereof) associated with the volatile memory 204.

Content information (which may also be referred to as tag information or address information) may indicate which data is stored in a set of volatile memory cells. For example, the content information (e.g., a tag address) for a set of one or more volatile memory cells may indicate which set of one or more non-volatile memory cells currently has data stored in the set of one or more volatile memory cells. Validity information may indicate whether the data stored in a set of volatile memory cells is actual data (e.g., data having an intended order or form) or placeholder data (e.g., data being random or dummy, not having an intended or important order). And dirty information may indicate whether the data stored in a set of one or more volatile memory cells of the volatile memory 204 is different than corresponding data stored in a set of one or more non-volatile memory cells of the non-volatile memory 206. For example, dirty information may indicate whether data stored in a set of volatile memory cells has been updated relative to data stored in the non-volatile memory 206.

The memory array 252 may include memory cells that store storage information (e.g., content and validity information) for an associated bank (e.g., BK0) of the volatile memory 204. The storage information may be stored on a per-page basis (e.g., there may be respective storage information for each page of the associated non-volatile memory bank). The interface controller 202 may check for requested data in the volatile memory 204 by referencing the storage information in the memory array 252. For instance, the interface controller 202 may receive, from a host device, a retrieval command for data in a set of non-volatile memory cells in the non-volatile memory 206. The interface controller 202 may use a set of one or more address bits (e.g., a set of row address bits) targeted by the access request to reference the storage information in the memory array 252. For instance, using set-associative mapping, the interface controller 202 may reference the content information in the memory array 252 to determine which set of volatile memory cells, if any, stores the requested data.

In addition to storing content information for volatile memory cells, the memory array 252 may also store validity information that indicates whether the data in a set of volatile memory cells is actual data (also referred to as valid data) or random data (also referred to as invalid data). For example, the volatile memory cells in the volatile memory 204 may initially store random data and continue to do so until the volatile memory cells are written with data from a host device or the non-volatile memory 206. To track which data is valid, the memory array 252 may be configured to set a bit for each set of volatile memory cells when actual data is stored in that set of volatile memory cells. This bit may be referred to a validity bit or a validity flag. As with the content information, the validity information stored in the memory array 252 may be stored on a per-page basis. Thus, each validity bit may indicate the validity of data stored in an associated page in some examples.

The memory array 254 may be similar to the memory array 252 and may also include memory cells that store validity information for a bank (e.g., BK0) of the volatile memory 204 that is associated with the memory array 252. However, the validity information stored in the memory array 254 may be stored on a subblock basis as opposed to a per-page basis for the memory array 252. For example, the validity information stored in the memory cells of the memory array 254 may indicate the validity of data for subsets of volatile memory cells in a set (e.g., page) of volatile memory cells. As an example, the validity information in the memory array 254 may indicate the validity of each subset (e.g., 64B) of data in a page of data stored in BK0 of the volatile memory 204. Storing content information and validity information on a per-page basis in the memory array 252 may allow the interface controller 202 to quickly and efficiently determine whether there is a hit or miss for data in the volatile memory 204. Storing validity information on a subblock basis may allow the interface controller 202 to determine which subsets of data to preserve in the non-volatile memory 206 during an eviction process.

Each cache management circuit set may also include a respective pair of registers coupled with the command circuitry 230, the engines 246, the memory interface circuitry 234, the memory interface circuitry 240, and the memory arrays for that cache management circuit set, among other components. For example, a cache management circuit set may include a first register (e.g., a register 256 which may be an open page tag (OPT) register) configured to receive storage information (e.g., one or more bits of tag information, validity information, or dirty information) from the memory array 252 or the scheduler 248-$b$ or both. The cache management circuitry set may also include a second register (e.g., a register 258 which may be a victim page tag (VPT) register) configured to receive storage information from the memory array 254 and the scheduler 248-$a$ or both. The information in the register 256 and the register 258 may be transferred to the command circuitry 230 and the engines 246 to enable decision-making by these components. For example, the command circuitry 230 may issue commands for reading the non-volatile memory 206 or the volatile memory 204 based on content information from the register 256.

The engine 246-$a$ may be coupled with the register 256, the register 258, and the schedulers 248. The engine 246-$a$ may be configured to receive storage information from various components and issue commands to the schedulers 248 based on the storage information. For example, when the interface controller 202 is in a first mode such as a write-through mode, the engine 246-$a$ may issue commands to the scheduler 248-$b$ and in response the scheduler 248-$b$ to initiate or facilitate the transfer of data from the buffer 218 to both the volatile memory 204 and the non-volatile memory 206. Alternatively, when the interface controller 202 is in a second mode such as a write-back mode, the engine 246-$a$ may issue commands to the scheduler 248-$b$ and in response the scheduler 248-$b$ may initiate or facilitate the transfer of data from the buffer 218 to the volatile memory 204. In the event of a write-back operation, the data stored in the volatile memory 204 may eventually be transferred to the non-volatile memory 206 during a subsequent eviction process.

The engine 246-$b$ may be coupled with the register 258 and the scheduler 248-$a$. The engine 246-$b$ may be configured to receive storage information from the register 258 and issue commands to the scheduler 248-$a$ based on the storage information. For instance, the engine 246-$b$ may issue commands to the scheduler 248-$a$ to initiate or facilitate transfer of dirty data from the buffer 220 to the non-volatile memory 206 (e.g., as part of an eviction process). If the buffer 220 holds a set of data transferred from the volatile memory 204 (e.g., victim data), the engine 246-$b$ may indicate which one or more subsets (e.g., which 64B) of the set of data in the buffer 220 should be transferred to the non-volatile memory 206.

The scheduler 248-$a$ may be coupled with various components of the interface controller 202 and may facilitate accessing the non-volatile memory 206 by issuing commands to the memory interface circuitry 234. The commands issued by the scheduler 248-$a$ may be based on commands from the command circuitry 230, the engine 246-$a$, the engine 246-$b$, or a combination of these components. Similarly, the scheduler 248-$b$ may be coupled with various components of the interface controller 202 and may facilitate accessing the volatile memory 204 by issuing commands to the memory interface circuitry 240. The commands issued by the scheduler 248-$b$ may be based on commands from the command circuitry 230 or the engine 246-$a$, or both.

The memory interface circuitry 234 may communicate with the non-volatile memory 206 via one or more of the data bus interface 212 and the C/A bus interface 214. For example, the memory interface circuitry 234 may prompt the C/A bus interface 214 to relay commands issued by the memory interface circuitry 234 over the C/A bus 236 to a local controller in the non-volatile memory 206. And the memory interface circuitry 234 may transmit to, or receive data from, the non-volatile memory 206 over the data bus 232. In some examples, the commands issued by the memory interface circuitry 234 may be supported by the non-volatile memory 206 but not the volatile memory 204 (e.g., the commands issued by the memory interface circuitry 234 may be different than the commands issued by the memory interface circuitry 240).

The memory interface circuitry 240 may communicate with the volatile memory 204 via one or more of the data bus interface 216 and the C/A bus interface 264. For example, the memory interface circuitry 240 may prompt the C/A bus interface 264 to relay commands issued by the memory interface circuitry 240 over the C/A bus 242 to a local controller of the volatile memory 204. And the memory interface circuitry 240 may transmit to, or receive data from, the volatile memory 204 over one or more data buses 238. In some examples, the commands issued by the memory interface circuitry 240 may be supported by the volatile memory 204 but not the non-volatile memory 206 (e.g., the commands issued by the memory interface circuitry 240 may be different than the commands issued by the memory interface circuitry 234).

Together, the components of the interface controller 202 may operate the non-volatile memory 206 as a main memory and the volatile memory 204 as a cache. Such operation may be prompted by one or more access commands (e.g., read/retrieval commands/requests and write/storage commands/requests) received from a host device.

In some examples, the interface controller 202 may receive a storage command from the host device. The storage command may be received over the C/A bus 226 and transferred to the command circuitry 230 via one or more of the C/A bus interface 210 and the decoder 228. The storage command may include or be accompanied by address bits that target a memory address of the non-volatile memory 206. The data to be stored may be received over the data bus 260 and transferred to the buffer 218 via the data bus interface 208. In a write-through mode, the interface controller 202 may transfer the data to both the non-volatile memory 206 and the volatile memory 204. In a write-back mode, the interface controller 202 may transfer the data to only the volatile memory 204. In either mode, the interface controller 202 may first check to see if the volatile memory 204 has memory cells available to store the data. To do so, the command circuitry 230 may reference the memory array 252 (e.g., using a set of the memory address bits) to determine whether one or more of the n sets (e.g., pages) of volatile memory cells associated with the memory address are empty (e.g., store random or invalid data). In some cases, a set of volatile memory cells in the volatile memory 204 may be referred to as a line or cache line.

If one of then associated sets of volatile memory cells is available for storing information, the interface controller 202 may transfer the data from the buffer 218 to the volatile memory 204 for storage in that set of volatile memory cells. But if no associated sets of volatile memory cells are empty, the interface controller 202 may initiate an eviction process to make room for the data in the volatile memory 204. The eviction process may involve transferring the old data (e.g., existing data) in one of the n associated sets of volatile memory cells to the buffer 220. The dirty information for the old data may also be transferred to the memory array 254 or register 258 for identification of dirty subsets of the old data. After the old data is stored in the buffer 220, the new data can be transferred from the buffer 218 to the volatile memory 204 and the old data can be transferred from the buffer 220 to the non-volatile memory 206. In some cases, dirty subsets of the old data are transferred to the non-volatile memory 206 and clean subsets (e.g., unmodified subsets) are discarded. The dirty subsets may be identified by the engine 246-b based on dirty information transferred (e.g., from the volatile memory 204) to the memory array 254 or register 258 during the eviction process.

In another example, the interface controller 202 may receive a retrieval command from the host device. The retrieval command may be received over the C/A bus 225 and transferred to the command circuitry 230 via one or more of the C/A bus interface 210 and the decoder 228. The retrieval command may include address bits that target a memory address of the non-volatile memory 206. Before attempting to access the targeted memory address of the non-volatile memory 206, the interface controller 202 may check to see if the volatile memory 204 stores the data. To do so, the command circuitry 230 may reference the memory array 252 (e.g., using a set of the memory address bits) to determine whether one or more of the n sets of volatile memory cells associated with the memory address stores the requested data. If the requested data is stored in the volatile memory 204, the interface controller 202 may transfer the requested data to the buffer 218 for transmission to the host device over the data bus 260.

If the requested data is not stored in the volatile memory 204, the interface controller 202 may retrieve the data from the non-volatile memory 206 and transfer the data to the buffer 218 for transmission to the host device over the data bus 260. Additionally, the interface controller 202 may transfer the requested data from the buffer 218 to the volatile memory 204 so that the data can be accessed with a lower latency during a subsequent retrieval operation. Before transferring the requested data, however, the interface controller 202 may first determine whether one or more of the n associated sets of volatile memory cells are available to store the requested data. The interface controller 202 may determine the availability of the n associated sets of volatile memory cells by communicating with the related cache management circuit set. If an associated set of volatile memory cells is available, the interface controller 202 may transfer the data in the buffer 218 to the volatile memory 204 without performing an eviction process. Otherwise, the interface controller 202 may transfer the data from the buffer 218 to the volatile memory 204 after performing an eviction process.

The memory subsystem 200 may be implemented in one or more configurations, including one-chip versions and multi-chip versions. A multi-chip version may include one or more constituents of the memory subsystem 200, including the interface controller 202, the volatile memory 204, and the non-volatile memory 206 (among other constituents or combinations of constituents), on a chip that is separate from a chip that includes one or more other constituents of the memory subsystem 200. For example, in one multi-chip version, respective separate chips may include each of the interface controller 202, the volatile memory 204, and the non-volatile memory 206. In contrast, a one-chip version may include the interface controller 202, the volatile memory 204, and the non-volatile memory 206 on a single chip.

In some examples, interface controller 202 may include various circuitry or features to provide direct access to non-volatile memory 206 and/or to volatile memory 204 for testing. For example, interface controller 202 may be configured to determine whether a first mode (e.g., a test mode) of memory subsystem 200 is enabled, such as based on a value stored in a register (e.g., a mode register that may be used for providing configuration information to interface controller 202). In response to interface controller 202 determining that the first mode is enabled, interface controller 202 may disable (e.g., bypass) the cache circuitry and provide direct access to non-volatile memory 206. For example, if interface controller 202 determines that memory subsystem 200 is operating in a test mode (e.g., with the first mode enabled), interface controller 202 may bypass some or all of the blocks related to cache management, including volatile memory 204, cache management circuitry 244, command circuitry 230, engines 246, schedulers 248, and/or other components of interface controller 202. Interface controller 202 may, when operating in a test mode, forward memory access commands received from a host device via C/A bus interface 210 directly to memory interface circuitry 234.

Figure 3:
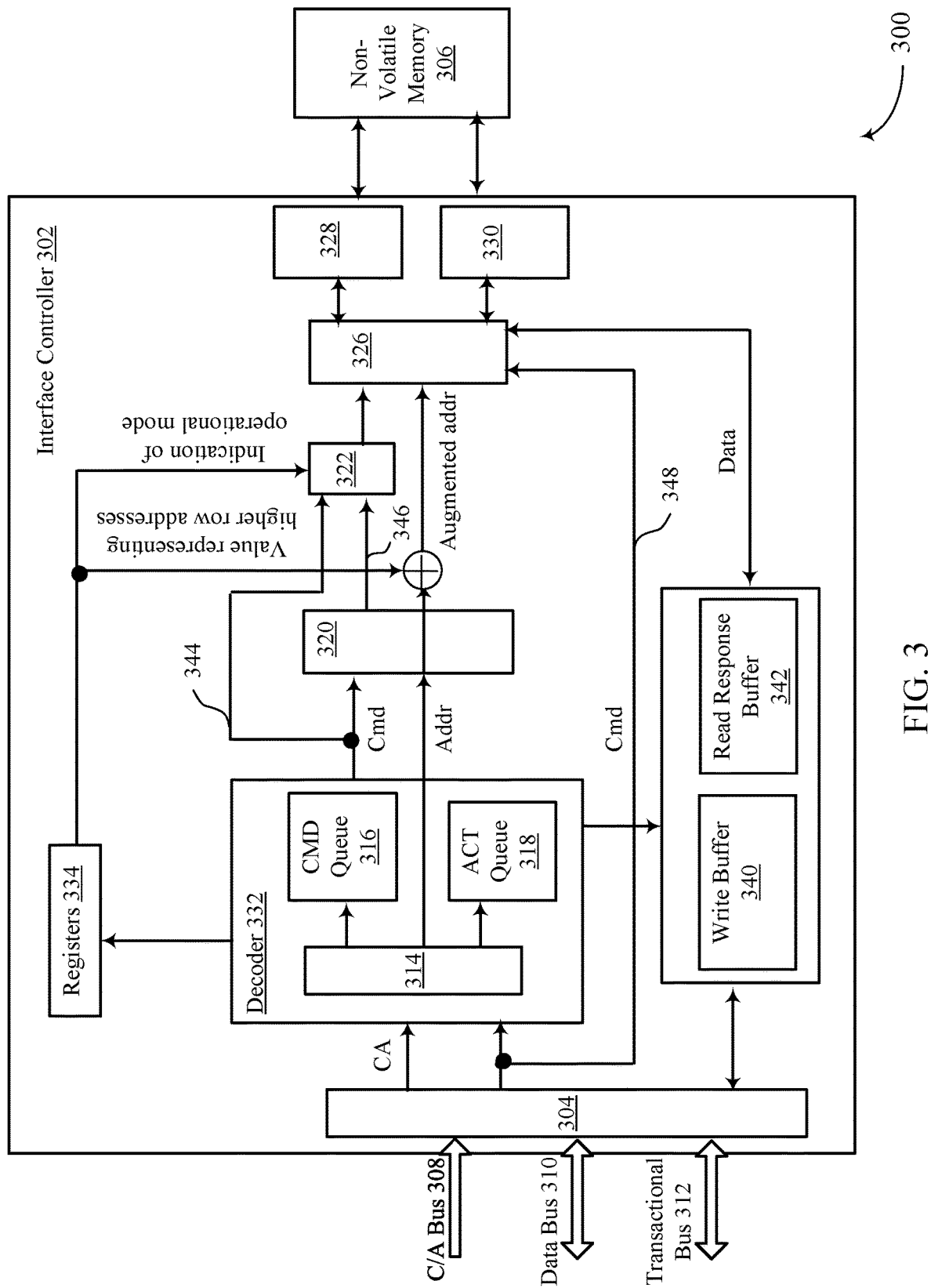
FIG. 3 illustrates an exemplary system or subsystem that supports direct testing for in-package memory in accordance with examples of the present disclosure.

FIG. 3 illustrates an example of memory subsystem 300 that supports direct testing of in-package memory in accordance with examples as disclosed herein. The memory subsystem 300 may be an example of the memory subsystem 110, 200 described with reference to FIGS. 1 and 2, respectively. Accordingly, the memory subsystem 300 may interact with a host device as described with reference to FIGS. 1 and 2. The memory subsystem 300 may include an interface controller 302 and a non-volatile memory 306, which may be examples of the interface controller 202 and the non-volatile memory 206 respectively, as described with reference to FIG. 2. In some examples, memory subsystem 300 may also include a volatile memory or other components not shown in FIG. 3.

Interface controller 302 may include a host interface 304 for communicating with a host device (e.g., an ATE). Host interface 304 may be an example of or may represent a C/A bus interface 210 and/or data bus interface 208 described with reference to FIG. 2, and may be configured to communicate with a host device using C/A bus 308, data bus 310, and transactional bus 312, which may be examples of the corresponding buses described with reference to FIG. 2.

Interface controller 302 may include decoder 332, command circuitry 320, memory interface circuitry 326, C/A interface 328, and data interface 330, which may be examples of decoder 228, command circuitry 230, memory interface circuitry 234, C/A interface 212, and data interface 214, respectively, as described with reference to FIG. 2. During some operations (e.g., when a first operational mode of memory subsystem 300 is disabled, such as when memory subsystem 300 is operating in a given mode, such as in a normal operational mode), these components of interface controller 302 may operate as described with reference to FIG. 2.

Decoder 332 may be configured to receive commands from a host device and may include decoding element 314 that may be configured to decode commands received from a host device.

Decoder 332 may include command queue 316. Decoder 332 may be configured to store column access strobe (CAS) commands received from a host device in command queue 316 for subsequent execution. In some examples, a CAS command may specify a memory access operation (e.g., a read or write operation) and/or may specify a clock synchronization operation (e.g., by including a clock synchronization option such as WS_FS, WS_RD, WS_WR). Clock synchronization commands (e.g., commands that specify a clock synchronization operation) may be associated with synchronizing two clock signals used by memory subsystem 300, such as synchronizing a system clock signal and a data clock signal.

In some examples, when memory subsystem 300 is operating with a test mode enabled, CAS commands received by memory subsystem 300 may be forwarded from decoder 332 to memory interface circuitry 326 (e.g., via bypass path 344 or bypass path 348) whereas when memory subsystem 300 is operating with the test mode disabled (e.g., with a given operating mode enabled), memory interface circuitry 326 may generate CAS commands automatically.

Decoder 332 may include activate queue (ACT) 318. Decoder 332 may store activate commands received from the ATE in activate queue 318 for subsequent execution. Activate commands may be used to open (e.g., select) a row of memory cells in non-volatile memory 306 for a subsequent read or write operation, and may include or may be associated with a set of address bits corresponding to a row of non-volatile memory 306. In some examples, activating a row of non-volatile memory 306 may be based on receiving two sequential activation commands, ACT-1 and ACT-2. In some examples, ACT-1 and ACT-2 may be collectively referred to as an activate command.

In some examples, decoder 332 may include one or more additional queues or circuitry that are not shown in FIG. 3 that may facilitate the operations described herein or other relevant operations.

As previously discussed, interface controller 302 may determine whether a first operational mode of memory subsystem 300 is enabled, such as a test mode in which cache-related circuitry is bypassed, or whether a second operational mode is enabled, such as a given operating mode in which the memory subsystem 300 uses cache-related circuitry as described with reference to FIG. 2.

Interface controller 302 may include one or more registers 334. In some examples, registers 334 may be coupled with decoder 332. Registers 334 may represent mode registers, such as mode registers that are compliant with one or more industry standards or one or more industry or part specifications, such as LPDDR5 mode registers. For example, registers 334 may include or may represent LPDDR5 mode registers MR64, MR65, MR68, or other mode registers.

Interface controller 302 may determine whether the first operational mode is enabled or disabled based on reading a value from one of registers 334, where the value may provide an indication of the operational mode. In some examples, a host device may send a command to memory subsystem 300 to write a value to one of registers 334 (e.g., via host interface 304 and decoder 332) to provide an indication, to memory subsystem 300, that a test mode is enabled. In response to receiving this command from the host device, interface controller 302 may write the value to one of the registers 334.

In response to determining that the test mode is enabled, interface controller 302 may use a bypass path (e.g., a conductive path that bypasses cache circuitry), such as bypass path 344 or bypass path 348, among other examples, to forward commands received via host interface 304 to memory interface circuitry 326, thereby bypassing cache-related features (such as cache management circuitry) of interface controller 302. Memory interface circuitry 326 may receive the forwarded commands and perform one or more operations, such as memory accesses of non-volatile memory 306 based on the commands.

When memory subsystem 300 is operating with a given operating mode enabled and a test mode disabled, memory interface circuitry 326 may maintain a bank state machine for maintaining the timing of memory access operations. When memory subsystem 300 is operating with a test mode enabled, memory interface circuitry 326 may not maintain a bank state machine because the timing may instead be maintained by the host device.

In some examples, when memory subsystem 300 is operating with a test mode enabled, a clock domain crossing (CDC) in memory subsystem 300 may be bypassed to enable deterministic operation (e.g., because the CDC may not guarantee deterministic operation).

In some examples, memory interface circuitry 326 or decoder 332 may save a second indication of a clock synchronization command in command queue 316 when decoder 332 forwards a command that includes a first indication of a clock synchronization command (e.g., a clock synchronization option) to memory interface circuitry 326. Memory subsystem 300 may subsequently read the second indication of the clock synchronization command from the command queue 316 and perform a clock synchronization operation based on the second indication of the clock synchronization command.

In some examples, when memory subsystem 300 is operating with a test mode enabled, interface controller 302 may perform various operations associated with protocol translation between a protocol associated with the host interface 304 (e.g., an LPDDR protocol) and a protocol associated with accessing non-volatile memory 306.

For example, one challenge of performing direct testing of non-volatile memory 306 may be that non-volatile memory 306 may use a different protocol (or pin list) than the protocol (or pins) of host interface 304. For example, if non-volatile memory 306 is an 8 GB FeRAM memory, non-volatile memory 306 may use a total of 28 address bits for activating a row of non-volatile memory 306, which may include 23 row address bits (R0~R22), two bits for specifying a bank group (BG0/1), and three bits for specifying a bank within the bank group (BA0-2). However, memory subsystem 300 may receive fewer bits from the host device, such as 22 address bits (R0~R17, BG0/1, BA0/1) from two activate commands (ACT-1 and ACT-2). Thus, to support row activation for non-volatile memory 306 during testing of non-volatile memory 306, memory subsystem may include circuitry or features to augment the received row addresses. That is, memory subsystem 300 may receive one or more commands associated with a first address having a first quantity of bits and may generate a second address having a second (e.g., larger) quantity of bits based on the first address.

For example, one or more of registers 334 may be configured to store a value representing the higher row addresses of non-volatile memory 306 to enable protocol translation between row addresses received by host interface 304 (e.g., from a host device, ATE) in an activate command to row addresses used by non-volatile memory 306. For example, one of registers 334 may include a plurality of bits, such as six bits, that may be used to store the higher row addresses (e.g., row address bits R22:17) of non-volatile memory 306. In some examples, the value representing the higher row addresses of non-volatile memory 306 may be read, by memory subsystem 300, from a register 334 and appended to a row address received via host interface 304 before providing the (augmented) row address to memory interface circuitry 326.

Thus, in some examples, when memory subsystem 300 is operating with a test mode enabled, decoder 332 may forward an ACT command received using host interface 304 to memory interface circuitry 326, for example, after merging a row address of the ACT command with a value, such as a pre-defined value, stored in one of registers 334 without hashing, such as by merging a pre-defined MR64 value in one of registers 334 with the row address (e.g., such that R[23:0]={MR68OP[7:0], R[15:0]}). In some examples, in order to change a higher row address of non-volatile memory 306, the host device may issue a command, such as a mode register write (MRW) command, to memory subsystem 300 to update the MR64 value (e.g., to update a value in one of registers 334). The command may include the value to be stored in the register 334. In response to receiving this command from the host device, memory subsystem 300 may store the value received from the host device in the register 334.

In some examples, to support addressing of a quantity of banks per bank group of non-volatile memory 306 (e.g., to support eight banks per bank group) while memory subsystem 300 is operating in the test mode, a signal detected (e.g., received) at a first pin of memory subsystem 300 may be used to specify (e.g., indicate) a bank group. For example, when memory subsystem 300 is operating with the test mode enabled, a pin of host interface 304 (e.g., a C/A pin, such as CA5) may be used for (e.g., repurposed or reused for) receiving an indication of a bank group instead of determining a bank group using, for example, R12 (e.g., a bit of a row address) in an activate/precharge command (e.g., ACT-1/PRE) and a valid bit of a read/write command. In some examples, memory subsystem may detect an edge of a clock signal at the first pin, and may determine a value of a bank group of the non-volatile memory 306 based on detecting the edge of the clock signal. In some examples, memory subsystem 300 may append or merge the value of the bank group with the first address when generating the second (augmented) address.

In some examples, to support dynamic page sizes during test operations, a second pin of memory subsystem 300 may be used to receive an indication of a page size of non-volatile memory 306. For example, when memory subsystem 300 is operating with a test mode enabled, a pin of host interface 304 (e.g., a C/A pin, such as CA6) may be used for (e.g., repurposed or reused for) to receive an indication of a page size instead of using, for example, R13 in an ACT-1 command. Memory subsystem 300 may perform memory accesses of non-volatile memory 306 based on the indicated page size.

Interface controller 302 may include multiplexer 322, which may be coupled with one or more of registers 334 and with memory interface circuitry 326. Multiplexer 322 may be configured to switch between conductive paths 344 and 346 based on receiving an indication of an operational mode from a register 334. For example, multiplexer 322 may select conductive path 344 when the test mode is enabled and may select conductive path 346 when the test mode is disabled. Multiplexer 322 may be configured to receive a command via the selected conductive path and provide the command to memory interface circuitry 326.

In some examples, when memory subsystem 300 receives a write command when the test mode is enabled, memory interface circuitry 326 may retrieve (e.g., read) data to be written to non-volatile memory 306 from a write buffer 340 instead of from an OPD buffer (e.g., buffer 218) as described with reference to FIG. 2.

In some examples, when memory subsystem 300 receives a read command when the test mode is enabled, memory interface circuitry 326 may return (e.g., transmit, store) the data to a read response buffer 342 instead of to an OPD buffer (e.g., buffer 218) as described with reference to FIG. 2.

In some examples, when memory subsystem is operating in a test mode, mode register forwarding from an LP5 mode register (e.g., one of registers 334) to memory interface circuitry 326 may be omitted (e.g., stopped), because memory interface circuitry 326 may change various timings associated with memory accesses (e.g., frequency set point FSP, write latency WL, read latency RL) according to the LP5 mode register.

Figure 4:
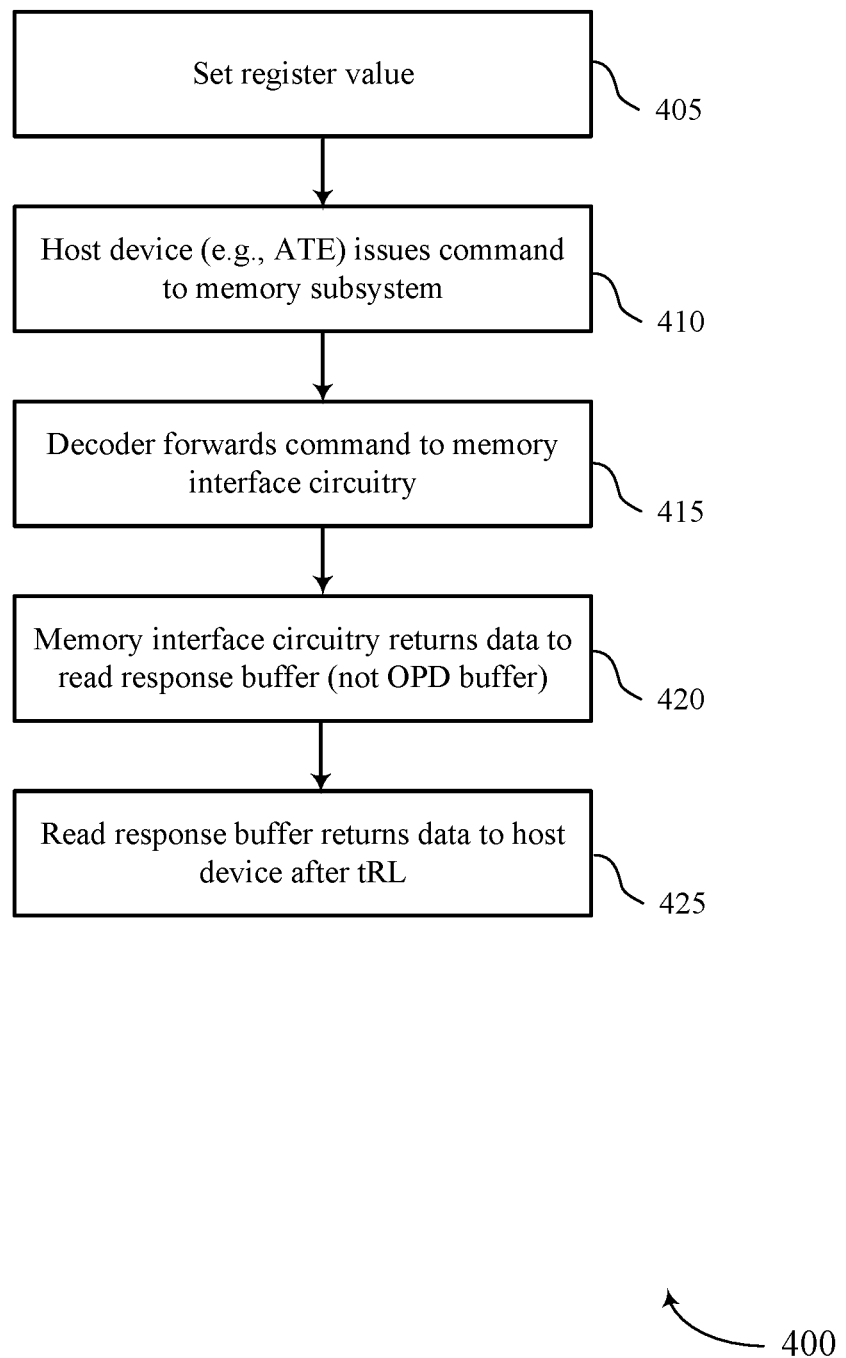
FIG. 4 illustrates an exemplary process flow that supports direct testing for in-package memory in accordance with examples of the present disclosure.

FIG. 4 depicts an exemplary process flow 400 that supports direct testing of in-package memory in accordance with examples as disclosed herein. Process flow 400 may depict a process performed by a host device (e.g., an ATE) and a memory subsystem (such as memory subsystem 200, 300) for reading data from a non-volatile memory of the memory subsystem when the memory subsystem is operating in a test mode. Additionally or alternatively, aspects of the process flow 400 may be implemented as instructions stored in memory (e.g., firmware stored in the volatile memory 120 and/or the non-volatile memory 125). For example, the instructions, when executed by a controller (e.g., the interface controller 115), may cause the controller to perform the operations of the process flow 400.

At 405, the memory subsystem may set a register value. For example, the memory subsystem may write a value to a mode register (e.g., one of registers 334) that indicates that the memory subsystem is operating in a test mode. In some examples, the memory subsystem may set the value of the register in response to receiving a command (such as an MRW command) from the test equipment.

At 410, a host device (e.g., an ATE) may issue a command to the memory subsystem, such as a read command. The memory subsystem may receive the command using a host interface, such as host interface 304, and provide the command to a decoder, such as decoder 332.

At 415, the decoder of the memory subsystem may forward the command to memory interface circuitry (e.g., memory interface circuitry 326). In some examples, the decoder may forward the command to the memory interface circuitry using a conductive path that bypasses cache circuitry of the memory subsystem, such as conductive path 344 or conductive path 348, among other examples. In some examples, the decoder may forward the command to the memory interface circuitry based on the memory subsystem determining, based on the register value, that the memory subsystem is operating with a test mode enabled.

At 420, the memory subsystem may read data from the non-volatile memory based on the command, and the memory interface may return the data to a read response buffer (e.g., read response buffer 342) rather than to an OPD buffer.

At 425, the read response buffer may return the data to the host device after a read latency time (tRL) has elapsed. In some examples, the read response buffer may return the data to the host device via the host interface, such as host interface 304.

Figure 5:
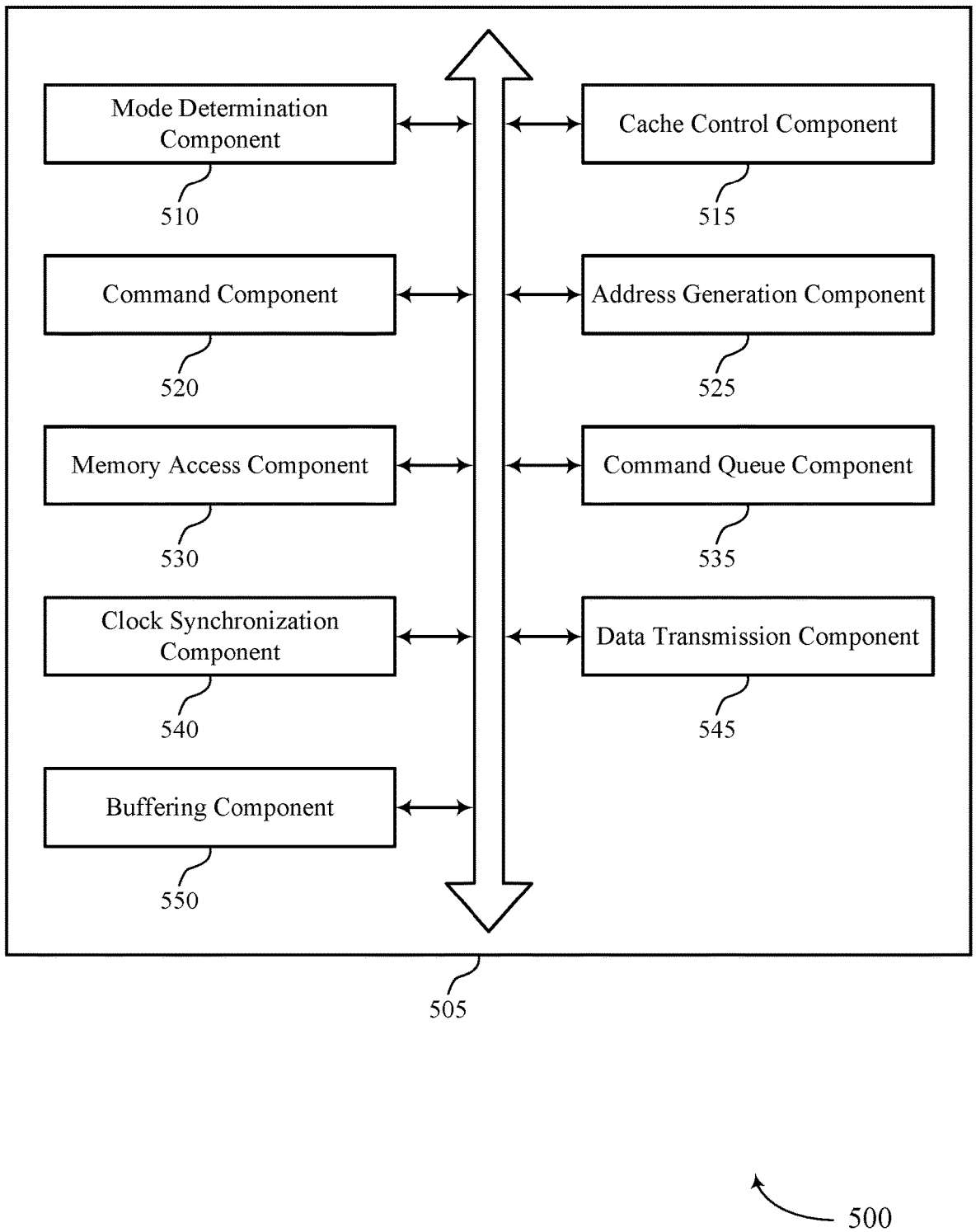
FIG. 5 shows a block diagram of a memory device that supports direct testing for in-package memory in accordance with examples of the present disclosure.

FIG. 5 shows a block diagram 500 of a memory device 505 that supports direct testing of in-package memory in accordance with examples as disclosed herein. The memory device 505 may be an example of aspects of a memory subsystem as described with reference to FIGS. 1 through 4. The memory device 505 may include a mode determination component 510, a cache control component 515, a command component 520, an address generation component 525, a memory access component 530, a command queue component 535, a clock synchronization component 540, a data transmission component 545, and a buffering component 550. Each of these modules may communicate, directly or indirectly, with one another (e.g., via one or more buses).

The mode determination component 510 may determine whether a first mode of the memory device is enabled.

The cache control component 515 may disable a cache of the memory device based on determining that the first mode is enabled.

The command component 520 may receive, from a host device after disabling the cache, one or more commands including a first address having a first quantity of bits.

In some examples, the one or more commands may include a first command that includes an indication of a clock synchronization operation for synchronizing a first clock with a second clock.

In some examples, the command component 520 may receive, from the host device before reading the value of the mode register, a second command associated with updating the value of the mode register. In some examples, the command component 520 may update the value of the mode register based on receiving the second command.

The address generation component 525 may generate a second address having a second quantity of bits based on the first address, the second quantity of bits larger than the first quantity of bits. In some examples, the address generation component 525 may read a value of a mode register. In some examples, the address generation component 525 may append the value of the mode register to the first address.

In some examples, the address generation component 525 may detect a clock edge at a first pin of the memory device. In some examples, the address generation component 525 may determine a value of a bank group of the memory device based on detecting the clock edge. In some examples, the address generation component 525 may append the value of the bank group of the memory device to the first address.

The memory access component 530 may perform an access operation on a memory array of the memory device based on generating the second address. In some examples, performing the access operation on the memory array includes activating a row of the memory array based at least in part on the second address. In some examples, performing the access operation on the memory array includes reading data from the memory array based at least in part on the second address. In some examples, performing the access operation on the memory array includes writing data to the memory array based at least in part on the second address The command queue component 535 may save a second indication of the clock synchronization operation in a command queue of the memory device. In some examples, the command queue component 535 may read the second indication of the clock synchronization operation from the command queue after saving the second indication of the clock synchronization operation.

The clock synchronization component 540 may perform the clock synchronization operation based on reading the second indication from the command queue.

The data transmission component 545 may transmit the data to the host device.

The buffering component 550 may retrieve the data from a write buffer of the memory device before writing the data at the second address of the array.

Figure 6:
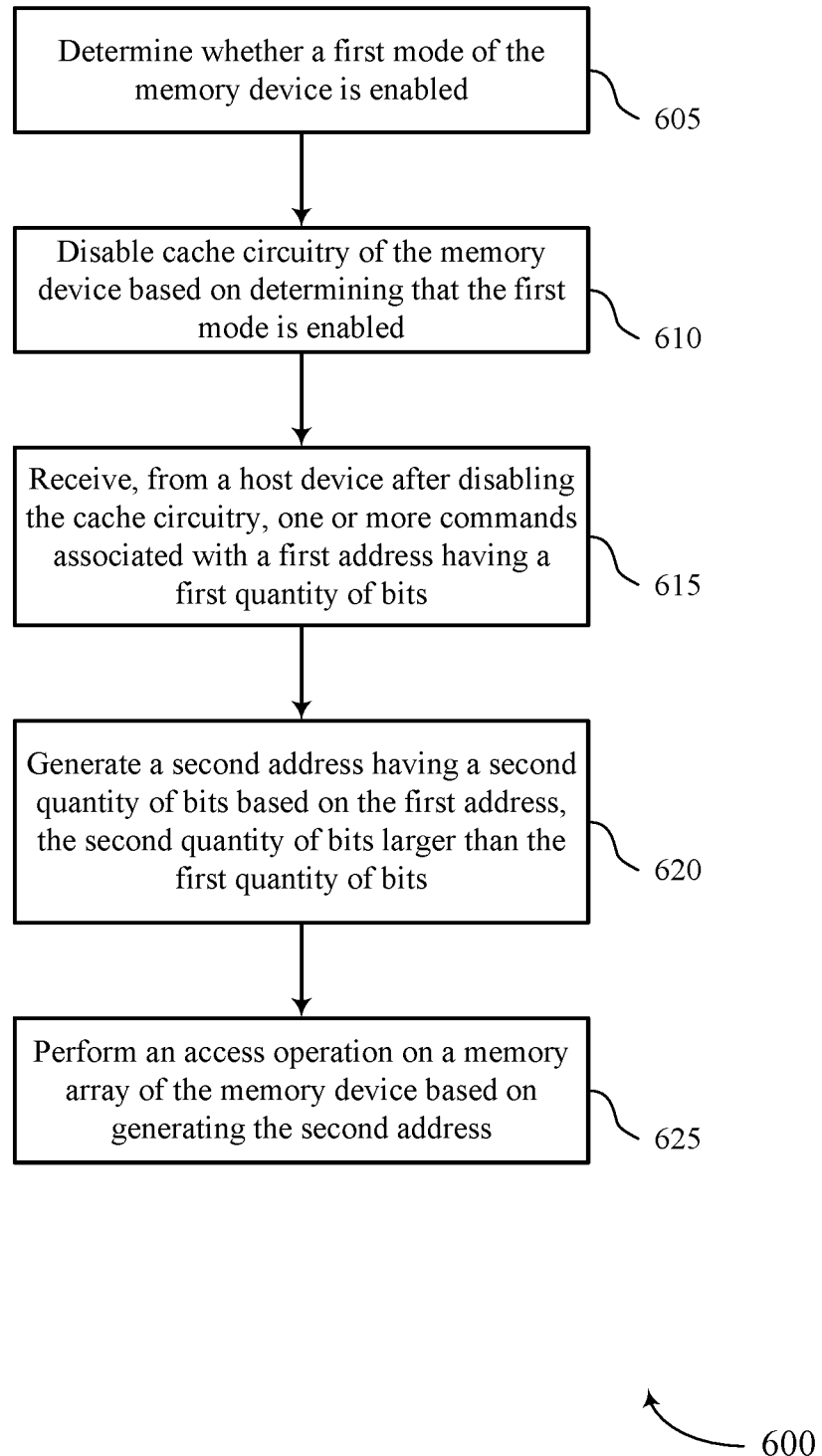
FIG. 6 shows a flowchart illustrating a method or methods that support direct testing for in-package memory in accordance with examples of the present disclosure.

FIG. 6 shows a flowchart illustrating a method or methods 600 that supports bypass for testing in-package memory in accordance with aspects of the present disclosure. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may determine whether a first mode of the memory device is enabled. The operations of 605 may be performed according to the methods described herein. In some examples, aspects of the operations of 605 may be performed by a mode determination component as described with reference to FIG. 5.

At 610, the memory device may disable a cache of the memory device based on determining that the first mode is enabled. The operations of 610 may be performed according to the methods described herein. In some examples, aspects of the operations of 610 may be performed by a cache control component as described with reference to FIG. 5.

At 615, the memory device may receive, from a host device after disabling the cache, one or more commands including a first address having a first quantity of bits. The operations of 615 may be performed according to the methods described herein. In some examples, aspects of the operations of 615 may be performed by a command component as described with reference to FIG. 5.

At 620, the memory device may generate a second address having a second quantity of bits based on the first address, the second quantity of bits larger than the first quantity of bits. The operations of 620 may be performed according to the methods described herein. In some examples, aspects of the operations of 620 may be performed by an address generation component as described with reference to FIG. 5.

At 625, the memory device may perform an access operation on a memory array of the memory device based on generating the second address. The operations of 625 may be performed according to the methods described herein. In some examples, aspects of the operations of 625 may be performed by a memory access component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for determining whether a first mode of the memory device is enabled, disabling a cache of the memory device based on determining that the first mode is enabled, receiving, from a host device after disabling the cache, one or more commands including a first address having a first quantity of bits, generating a second address having a second quantity of bits based on the first address, the second quantity of bits larger than the first quantity of bits, and performing an access operation on a memory array of the memory device based on generating the second address.

In some examples of the method 600 and the apparatus described herein, a first command of the one or more commands includes an indication of a clock synchronization operation for synchronizing a first clock with a second clock, and may include operations, features, means, or instructions for saving a second indication of the clock synchronization operation in a command queue of the memory device, reading the second indication of the clock synchronization operation from the command queue after saving the second indication of the clock synchronization operation, and performing the clock synchronization operation based on reading the second indication from the command queue.

In some examples of the method 600 and the apparatus described herein, performing the access operation on the memory array may include operations, features, means, or instructions for activating a row of the memory array based at least in part on the second address.

In some examples of the method 600 and the apparatus described herein, performing the access operation on the memory array may include operations, features, means, or instructions for reading data from the memory array based at least in part on the second address.

In some examples of the method 600 and the apparatus described herein, performing the access operation on the memory array may include operations, features, means, or instructions for writing data to the memory array based at least in part on the second address.

In some examples of the method 600 and the apparatus described herein, performing the access operation on the memory array may include operations, features, means, or instructions for transmitting the data to the host device.

In some examples of the method 600 and the apparatus described herein, performing the access operation on the memory array may include operations, features, means, or instructions for retrieving the data from a write buffer of the memory device before writing the data at the second address of the array.

In some examples of the method 600 and the apparatus described herein, generating the second address may include operations, features, means, or instructions for reading a value of a mode register, and appending the value of the mode register to the first address.

Some examples of the method 600 and the apparatus described herein may further include operations, features, means, or instructions for receiving, from the host device before reading the value of the mode register, a second command associated with updating the value of the mode register, and updating the value of the mode register based on receiving the second command.

In some examples of the method 600 and the apparatus described herein, generating the second address may include operations, features, means, or instructions for detecting a clock edge at a first pin of the memory device, determining a value of a bank group of the memory device based on detecting the clock edge, and appending the value of the bank group to the first address.

It should be noted that the methods described herein are possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, a protocol may refer to a definition of or standard for one or more communication procedures and one or more communication parameters supported for use by a device or component. For example, a protocol may define various operations, a timing and a frequency for those operations, a meaning of various commands or signals or both, one or more addressing scheme(s) for one or more memories, a type of communication for which pins are reserved, a size of data handled at various components such as interfaces, a data rate supported by various components such as interfaces, or a bandwidth supported by various components such as interfaces, among other parameters and metrics, or any combination thereof. Use of a shared protocol may enable interaction between devices because each device may operate in a manner expected and recognized by another device. For example, two devices that support the same protocol may interact according to the policies, procedures, and parameters defined by the protocol, whereas two devices that support different protocols may be incompatible. To illustrate, two devices that support different protocols may be incompatible because the protocols define different addressing schemes (e.g., different quantities of address bits). As another illustration, two devices that support different protocols may be incompatible because the protocols define different transfer procedures for responding to a single command (e.g., the burst length or quantity of bytes permitted in response to the command may differ). Merely translating a command to an action should not be construed as use of two different protocols. Rather, two protocols may be considered different if corresponding procedures or parameters defined by the protocols vary. For example, a device may be said to support two different protocols if the device supports different addressing schemes, or different transfer procedures for responding to a command.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or subregions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
    a memory array; and
    an interface controller coupled with the memory array and configured to cause the apparatus to:
        determine whether a first mode of the apparatus is enabled;
        disable cache circuitry of the apparatus based at least in part on determining that the first mode is enabled;
        receive, from a host device after disabling the cache circuitry, one or more commands associated with a first address having a first quantity of bits;
        generate a second address having a second quantity of bits based at least in part on the first address, the second quantity of bits larger than the first quantity of bits; and
        perform, while the cache circuitry is disabled, an access operation on the memory array based at least in part on generating the second address.

2. The apparatus of claim 1, wherein performing the access operation on the memory array comprises activating a row of the memory array based at least in part on the second address.

3. The apparatus of claim 1, wherein performing the access operation on the memory array comprises reading data from the memory array based at least in part on the second address and the interface controller is further configured to cause the apparatus to:
    transmit the data to the host device.

4. The apparatus of claim 1, wherein performing the access operation on the memory array comprises writing data to the memory array based at least in part on the second address and the interface controller is further configured to cause the apparatus to: retrieve the data from a write buffer of a memory subsystem before writing the data to the memory array.

5. The apparatus of claim 1, wherein a first command of the one or more commands comprises an indication of a clock synchronization operation for synchronizing a first clock with a second clock, wherein the interface controller is further configured to cause the apparatus to:
    save a second indication of the clock synchronization operation in a command queue of the apparatus;
    read the second indication of the clock synchronization operation from the command queue after saving the second indication of the clock synchronization operation; and
    perform the clock synchronization operation based at least in part on reading the second indication from the command queue.

6. The apparatus of claim 1, wherein the first address comprises a first row address and the second address comprises a second row address.

7. An apparatus, comprising:
    a memory array; and
    an interface controller coupled with the memory array and configured to cause the apparatus to:
        determine whether a first mode of the apparatus is enabled;
        disable cache circuitry of the apparatus based at least in part on determining that the first mode is enabled;
        receive, from a host device after disabling the cache circuitry, one or more commands associated with a first address having a first quantity of bits;
        generate a second address having a second quantity of bits based at least in part on the first address, the second quantity of bits larger than the first quantity of bits, wherein generating the second address comprises:
            reading a value of a mode register; and
            appending the value of the mode register to the first address; and
        perform an access operation on the memory array based at least in part on generating the second address.

8. The apparatus of claim 7, wherein the interface controller is further configured to cause the apparatus to:
    receive, from the host device before reading the value of the mode register, a second command associated with updating the value of the mode register; and
    update the value of the mode register based at least in part on receiving the second command.

9. An apparatus, comprising:
    a memory array; and
    an interface controller coupled with the memory array and configured to cause the apparatus to:
        determine whether a first mode of the apparatus is enabled;
        disable cache circuitry of the apparatus based at least in part on determining that the first mode is enabled;
        receive, from a host device after disabling the cache circuitry, one or more commands associated with a first address having a first quantity of bits;
        generate a second address having a second quantity of bits based at least in part on the first address, the second quantity of bits larger than the first quantity of bits, wherein generating the second address comprises:
            detecting a clock edge at a first pin of the apparatus;

determining a value of a bank group of the memory array based at least in part on detecting the clock edge; and appending the value of the bank group of the memory array to the first address; and perform, while the cache circuitry is disabled, an access operation on the memory array based at least in part on generating the second address.

10. An apparatus, comprising:

an array of memory cells; and an interface controller coupled with the array of memory cells, the interface controller comprising:

a host interface configured to receive commands from a host device, cache management circuitry coupled with a decoder, and memory interface circuitry coupled with the cache management circuitry and with the decoder, the memory interface circuitry configured to access the array of memory cells based on the commands received from the host device, wherein the interface controller is configured to cause the apparatus to:

receive a command from the host device, determine whether a first operational mode of the apparatus is enabled, wherein the first operational mode comprises disabling cache circuitry, and provide, while the cache circuitry is disabled, the command directly to the memory interface circuitry via a bypass path based at least in part on determining that the first operational mode is enabled.

11. The apparatus of claim 10, further comprising:

a first register configured to store an indication of an operational mode of the apparatus, wherein the interface controller is configured to determine whether the first operational mode is enabled based at least in part on the indication of the operational mode in the first register.

12. An apparatus, comprising:

an array of memory cells;

an interface controller coupled with the array of memory cells, the interface controller comprising:

a host interface configured to receive commands from a host device, cache management circuitry coupled with a decoder, and memory interface circuitry coupled with the cache management circuitry and with the decoder, the memory interface circuitry configured to access the array of memory cells based on the commands received from the host device, wherein the interface controller is configured to cause the apparatus to:

receive a command from the host device, determine whether a first operational mode of the apparatus is enabled, and provide the command directly to the memory interface circuitry via a bypass path based at least in part on determining that the first operational mode is enabled; and a second register configured to store a value indicating a higher row address of the array of memory cells, wherein the interface controller is further configured to cause the apparatus to:

identify a first address associated with the command, generate a second address based at least in part on the first address and on determining that the first operational mode is enabled, wherein generating the second address comprises appending the value indicating the higher row address to the first address, and provide the second address to the memory interface circuitry, wherein the memory interface circuitry is configured to access the array of memory cells based at least in part on the second address.

13. The apparatus of claim 12, wherein the host interface comprises a first pin and the interface controller is further configured to cause the apparatus to:

detect a clock edge at the first pin; and determine a value of a bank group of the array of memory cells based at least in part on detecting the clock edge and on determining that the first operational mode is enabled, wherein generating the second address comprises appending the value of the bank group to the first address.

14. A non-transitory computer-readable medium storing code comprising instructions, which when executed by a processor of an electronic device, cause the electronic device to:

determine whether a first mode of an apparatus is enabled;

disable cache circuitry of the apparatus based at least in part on determining that the first mode is enabled;

receive, from a host device after disabling the cache circuitry, one or more commands associated with a first address having a first quantity of bits;

generate a second address having a second quantity of bits based at least in part on the first address, the second quantity of bits larger than the first quantity of bits; and perform, while the cache circuitry is disabled, an access operation on a memory array of the electronic device based at least in part on generating the second address.

15. The non-transitory computer-readable medium of claim 14, wherein performing the access operation on the memory array comprises activating a row of the memory array based at least in part on the second address.

16. The non-transitory computer-readable medium of claim 14, wherein performing the access operation on the memory array comprises reading data from the memory array based at least in part on the second address and wherein the instructions, when executed by the processor of the electronic device, further cause the electronic device to:

transmit the data to the host device.

17. The non-transitory computer-readable medium of claim 14, wherein performing the access operation on the memory array comprises writing data to the memory array based at least in part on the second address and wherein the instructions, when executed by the processor of the electronic device, further cause the electronic device to:

retrieve the data from a write buffer of a memory subsystem before writing the data to the memory array.

18. The non-transitory computer-readable medium of claim 14, wherein a first command of the one or more commands comprises an indication of a clock synchronization operation for synchronizing a first clock with a second clock, and wherein the instructions, when executed by the processor of the electronic device, further cause the electronic device to:

save a second indication of the clock synchronization operation in a command queue of the non-transitory computer-readable medium;

read the second indication of the clock synchronization operation from the command queue after saving the second indication of the clock synchronization operation; and perform the clock synchronization operation based at least in part on reading the second indication from the command queue.

19. The non-transitory computer-readable medium of claim 14, wherein the first address comprises a first row address and the second address comprises a second row address.

20. A non-transitory computer-readable medium storing code comprising instructions, which when executed by a processor of an electronic device cause the electronic device to:

determine whether a first mode of an apparatus is enabled;

disable cache circuitry of the apparatus based at least in part on determining that the first mode is enabled;

receive, from a host device after disabling the cache circuitry, one or more commands associated with a first address having a first quantity of bits;

generate a second address having a second quantity of bits based at least in part on the first address, the second quantity of bits larger than the first quantity of bits, wherein generating the second address comprises:
reading a value of a mode register; and
appending the value of the mode register to the first address; and perform an access operation on a memory array of the electronic device based at least in part on generating the second address.

21. The non-transitory computer-readable medium of claim 20, wherein the instructions, when executed by the processor of the electronic device, further cause the electronic device to:

receive, from the host device before reading the value of the mode register, a second command associated with updating the value of the mode register; and update the value of the mode register based at least in part on receiving the second command.

22. A non-transitory computer-readable medium storing code comprising instructions, which when executed by a processor of an electronic device, cause the electronic device to:

determine whether a first mode of an apparatus is enabled;

disable cache circuitry of the apparatus based at least in part on determining that the first mode is enabled;

receive, from a host device after disabling the cache circuitry, one or more commands associated with a first address having a first quantity of bits;

generate a second address having a second quantity of bits based at least in part on the first address, the second quantity of bits larger than the first quantity of bits, wherein generating the second address comprises:
detecting a clock edge at a first pin of the apparatus;
determining a value of a bank group of a memory array of the electronic device based at least in part on detecting the clock edge; and
appending the value of the bank group of the memory array to the first address; and perform an access operation on the memory array based at least in part on generating the second address.

* * * * *